US009831279B2

(12) United States Patent
Jin et al.

(10) Patent No.: US 9,831,279 B2
(45) Date of Patent: Nov. 28, 2017

(54) IMAGE SENSORS INCLUDING NON-UNIFORMLY DOPED TRANSFER GATE IN RECESS

(71) Applicant: Samsung Electronics Co., Ltd., Suwon-si, Gyeonggi-do (KR)

(72) Inventors: Younggu Jin, Suwon-si (KR); Jungchak Ahn, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/258,812

(22) Filed: Sep. 7, 2016

(65) Prior Publication Data

US 2017/0069672 A1 Mar. 9, 2017

(30) Foreign Application Priority Data

Sep. 9, 2015 (KR) ........................ 10-2015-0127754

(51) Int. Cl.
*H01L 27/146* (2006.01)

(52) U.S. Cl.
CPC .. *H01L 27/14614* (2013.01); *H01L 27/14643* (2013.01)

(58) Field of Classification Search
CPC .................... H01L 27/14614; H01L 27/14643
See application file for complete search history.

(56) References Cited

U.S. PATENT DOCUMENTS

| | | | | |
|---|---|---|---|---|
| 8,310,003 | B2 | 11/2012 | Kohyama | |
| 2007/0131987 | A1* | 6/2007 | Kim .................. | H01L 27/14603 257/290 |
| 2009/0261393 | A1 | 10/2009 | Sze | |
| 2011/0096208 | A1 | 4/2011 | Roy et al. | |
| 2012/0199934 | A1 | 8/2012 | Onuki et al. | |
| 2013/0009224 | A1 | 1/2013 | Ohri | |
| 2013/0193496 | A1* | 8/2013 | Hisanori ............... | H01L 31/103 257/292 |
| 2014/0151533 | A1 | 6/2014 | Watanabe et al. | |

FOREIGN PATENT DOCUMENTS

| | | | |
|---|---|---|---|
| JP | 2010-232477 | A | 10/2010 |
| JP | 2011-82427 | A | 4/2011 |
| KR | 10-1998-0012585 | A | 4/1998 |
| KR | 10-2005-0087143 | A | 8/2005 |
| KR | 10-2013-0087905 | A | 8/2013 |

* cited by examiner

*Primary Examiner* — Long Pham
(74) *Attorney, Agent, or Firm* — Myers Bigel, P.A.

(57) ABSTRACT

An image sensor includes a photoelectric conversion portion providing a recessed region, a transfer gate provided in the recessed region, and a floating diffusion region adjacent the transfer gate. The transfer gate includes a first pattern and a second pattern, which are sequentially stacked in the recessed region and have different conductivity types from each other.

20 Claims, 19 Drawing Sheets

IMAGE SENSORS INCLUDING NON-UNIFORMLY DOPED TRANSFER GATE IN RECESS

CROSS-REFERENCE TO RELATED APPLICATION

This U.S. non-provisional patent application claims priority under 35 U.S.C. §119 to Korean Patent Application No. 10-2015-0127754, filed on Sep. 9, 2015, in the Korean Intellectual Property Office, the entire contents of which are hereby incorporated by reference.

BACKGROUND OF THE INVENTION

Various embodiments described herein relate to image sensors, and in particular, to transfer gates of image sensors.

An image sensor is a device that converts optical images into electrical signals. With increased development of the computer and communications industries, there is an increased demand for high performance image sensors in a variety of applications such as digital cameras, camcorders, personal communication systems, gaming machines, security cameras, micro-cameras for medical applications, and/or robots.

The image sensors may be generally classified into charge coupled device (CCD) and complementary metal-oxide semiconductor (CMOS) image sensors. The CMOS image sensors may be operated using a simple operation method and may be configured to have signal processing circuits integrated on a single chip, and thus, the use of the CMOS image sensors makes it possible to realize scaled products. In addition, the CMOS image sensors can operate with relatively low consumption power, and thus, they are applicable to a product with low battery capacity (e.g., portable electronic devices). Furthermore, the CMOS image sensors may be fabricated using CMOS fabrication techniques, which may reduce manufacturing costs. Moreover, the use of the CMOS image sensors may provide images with high resolution, and thus, the demand for the CMOS image sensors is being increased.

A CMOS image sensor may include a photoelectric conversion region, a transfer gate and a floating diffusion region. When a voltage is applied to the transfer gate, charges generated in the photoelectric conversion region are transferred into the floating diffusion region.

SUMMARY

Some embodiments described herein provide an image sensor with a transfer gate including two regions, whose conductivity types are different from each other.

Some embodiments described herein provide an image sensor with a transfer gate including two regions, whose doping concentrations are different from each other.

According to some embodiments described herein, an image sensor may include a substrate, a photoelectric conversion portion in the substrate defining a recessed region in the substrate, a transfer gate provided in the recessed region, and a floating diffusion region adjacent the transfer gate. The transfer gate may include a first pattern and a second pattern, which are sequentially stacked in the recessed region and have different conductivity types from each other.

In some embodiments, the first pattern may include a p-type or intrinsic semiconductor material, and the second pattern may include an n-type semiconductor material.

In some embodiments, the first pattern may include an n-type or intrinsic semiconductor material, and the second pattern may include a p-type semiconductor material.

In some embodiments, the second pattern may have the same conductivity type as the floating diffusion region.

In some embodiments, the second pattern may have a width greater than that of the first pattern, when measured in a horizontal direction.

In some embodiments, the first pattern may include a plurality of portions that are spaced apart from each other in the horizontal direction.

In some embodiments, the second pattern may have a length greater than the first pattern, when measured in a vertical direction.

In some embodiments, the first pattern may be configured to face side and bottom surfaces of the recessed region and define an inner gap, and the second pattern may be in the inner gap of the first pattern.

In some embodiments, the image sensor may further include an insulating layer between the first pattern and the second pattern.

According to some embodiments described herein, an image sensor may include a substrate, a photoelectric conversion portion in the substrate including at least one first doped region and a second doped region, the second doped region defining at least one recessed region on the first doped region, a transfer gate in the recessed region, and a floating diffusion region adjacent the transfer gate. The transfer gate may include a first pattern and a second pattern, which are sequentially stacked in the recessed region and have the same conductivity type and different doping concentrations.

In some embodiments, the transfer gate may include a plurality of transfer gates, whose vertical lengths are different from each other.

In some embodiments, the first pattern may have a doping concentration lower than that of the second pattern.

In some embodiments, each of the first and second patterns may have a varying doping concentration in a direction from the second pattern toward the first pattern.

In some embodiments, the image sensor may further include an insulating layer between the first pattern and the second pattern.

In some embodiments, the second pattern and the floating diffusion region may have the same conductivity type.

According to some embodiments described herein, an image sensor may include a substrate having a face, a photoelectric conversion portion in the substrate, the photoelectric conversion portion defining a recess in the substrate that extends from the face into the substrate, a transfer gate in the recess that is non-uniformly doped in a direction extending from the face into the substrate, and a floating diffusion region adjacent the transfer gate.

In some embodiments, the transfer gate comprises a first region in the recess remote from the face and a second region in the recess adjacent the face, the first and second regions having opposite conductivity types.

In some embodiments, the transfer gate comprises a first region in the recess remote from the face and a second region in the recess adjacent the face, the first and second regions having a same conductivity type but different doping concentrations.

In some embodiments, the transfer gate is also non-uniformly doped in a direction extending along the face.

In some embodiments, the transfer gate comprises a first region in the recess remote from face, a second region in the recess adjacent the face and an insulating layer between the first and second regions.

In some embodiments, the transfer gate comprises a first region in the recess remote from face and a second region in the recess adjacent the face that is narrower than the first region in a direction extending along the face.

In some embodiments, the transfer gate comprises a first region in the recess remote from face and a plurality of second regions in the recess adjacent the face, each of which is narrower than the first region in a direction extending along the face.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
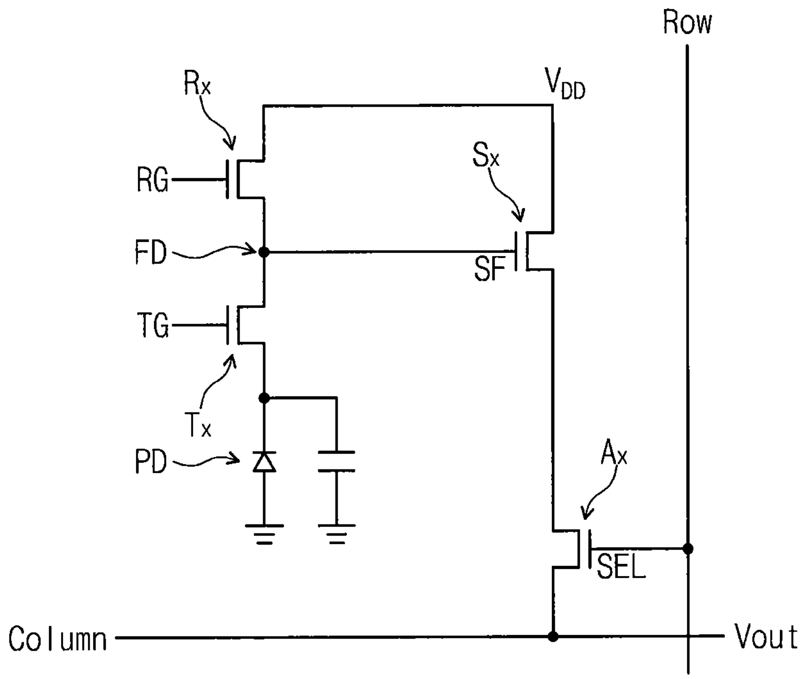
FIG. 1 is a circuit diagram illustrating an image sensor according to some embodiments described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments, unless explicitly described herein. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper", "horizontal", "vertical" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes", "including", "has", "having" and variants thereof, if used herein, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one of ordinary skill in the art to which example embodiments described herein belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
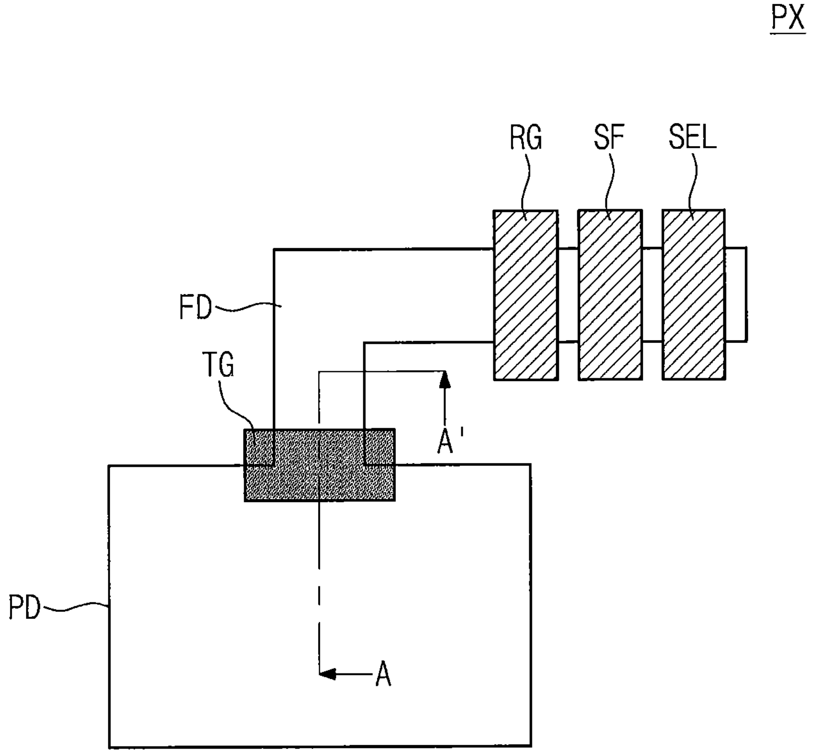
FIG. 2 is a plan view illustrating a unit pixel of an image sensor according to some embodiments described herein.

FIG. 1 is a circuit diagram illustrating an image sensor according to some embodiments described herein, and FIG. 2 is a plan view illustrating a unit pixel of an image sensor according to some embodiments described herein.

Referring to FIGS. 1 and 2, the image sensor may include a plurality of unit pixels, each of which includes a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SF, a reset gate RG, and a selection gate SEL, respectively. A photoelectric conversion portion may be provided in the photoelectric conversion region PD. The photoelectric conversion portion may be a photodiode with n- and p-doped regions. A drain of the transfer transistor TX may serve as a floating diffusion region FD. The floating diffusion region FD may also be used as a source of the reset transistor Rx. The floating diffusion region FD may be electrically connected to the source follower gate SF of the source follower transistor Sx. The source follower transistor Sx may be connected to the selection transistor Ax. The reset transistor Rx, the source follower transistor Sx and the selection transistor Ax may be shared by adjacent pixels, and this makes it possible to increase an integration density of the image sensor.

Hereinafter, an operation of an image sensor will be described with reference to FIGS. 1 and 2. When an external light is incident into the photoelectric conversion region PD, electron-hole pairs may be generated in the photoelectric conversion region PD. In this case, holes may be moved toward and accumulated in a p-type doped region, and electrons may be moved toward and accumulated in an n-type doped region. When the transfer transistor Tx is turned on, the electrons (or photoelectrons) may be transferred to and accumulated in the floating diffusion region FD. A change in amount of the accumulated electrons may lead to a change in gate bias of the source follower transistor Sx, and this may lead to a change in source potential of the source follower transistor Sx. Accordingly, if the selection transistor Ax is turned on, an amount of the photoelectrons may be read out as a signal to be transmitted through a column line. The reset transistor Rx may be turned on, before the transfer transistor Tx is turned on, and this may make it possible to reset the floating diffusion region FD. Here, by turning on the selection transistor Ax, a reset signal may be output through the column line, and the reset signal may be used as a reference signal in the operation of the image sensor.

Figure 3:
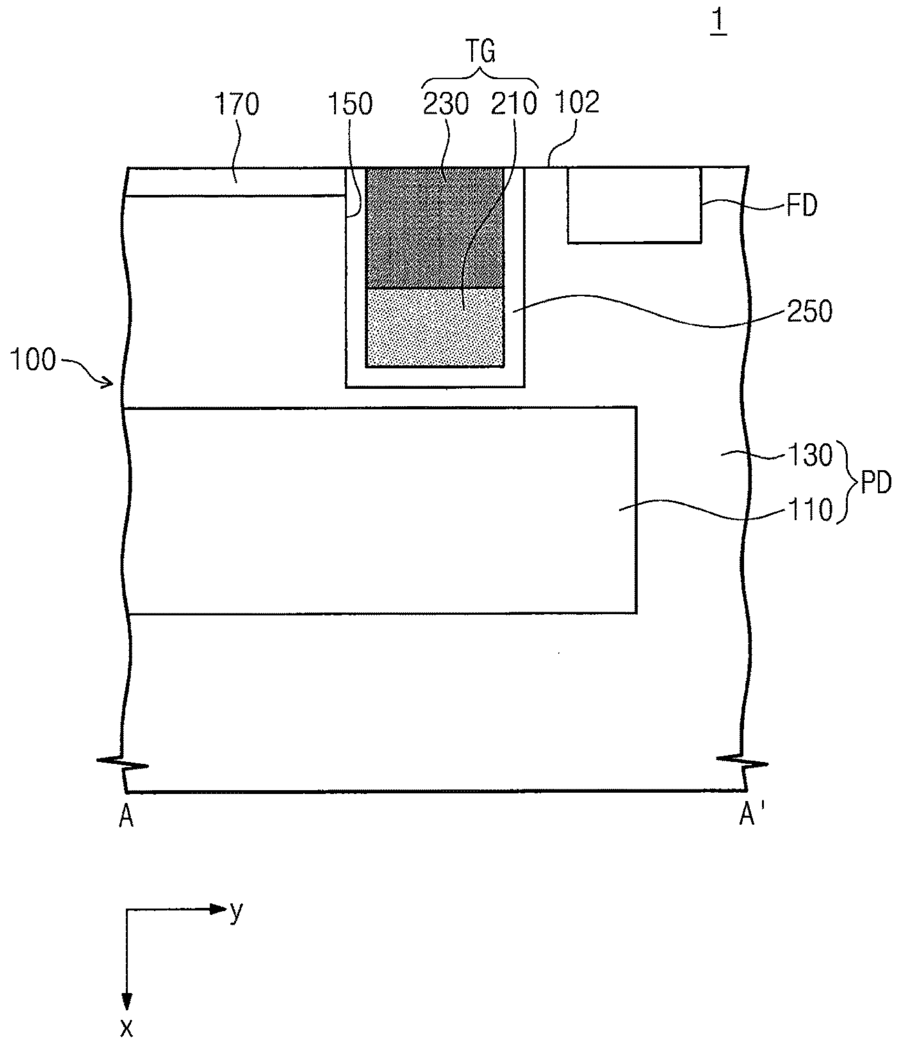
FIG. 3 is a sectional view taken along line A-A' of FIG. 2.

FIG. 3 is a sectional view taken along line A-A' of FIG. 2.

Referring to FIG. 3, an image sensor 1 may include a substrate 100 having therein the photoelectric conversion region PD, the transfer gate TG, and the floating diffusion region FD. Only a portion of the substrate 100 is illustrated. The substrate 100 includes a face 102. When light is incident into the photoelectric conversion region PD, electron-hole pairs may be generated in the photoelectric conversion region PD. In this case, holes may be moved toward and accumulated in a p-type doped region, and electrons may be moved toward and accumulated in an n-type doped region. Hereinafter, for the sake of simplicity, the description that follows will refer to an example in which the image sensor 1 includes NMOS transistors.

The photoelectric conversion region PD may include a first doped region 110 and a second doped region 130. The first doped region 110 may be doped to have the same conductivity type as the floating diffusion region FD. For example, the first doped region 110 may be doped with n-type impurities. The second doped region 130 may be disposed on the first doped region 110. The second doped region 130 may be doped with, for example, p-type impurities. A recessed region 150, which is recessed in a first direction x from a top surface of the second doped region 130 (corresponding to the face 102 of the substrate 100) toward the first doped region 110, may be defined in the second doped region 130. The recessed region 150 may be spaced apart from the first doped region 110. A blocking region 170 may be provided over the photoelectric conversion region PD. The blocking region 170 may be doped with p-type impurities. The blocking region 170 may be doped to have a doping concentration higher than that of the second doped region 130. The blocking region 170 may reduce or prevent electric charges from being generated in the surface of the photoelectric conversion region PD, and thus, it is possible to reduce or prevent the image sensor 1 from suffering from noise.

In contrast, when the image sensor 1 is composed of PMOS transistors, the first doped region 110 may be doped with p-type impurities and the second doped region 130 may be doped with n-type impurities. The blocking region 170 may be doped with n-type impurities. The blocking region 170 may be doped to have a doping concentration higher than that of the second doped region 130.

The transfer gate TG may be provided in the recessed region 150. For example, the transfer gate TG may overlap with the photoelectric conversion region PD, when viewed in a plan view. In some embodiments, the transfer gate TG may have a pillar-shaped structure. However, the embodiments described herein are not limited to a specific shape of the transfer gate TG. The transfer gate TG may be formed of or include a polysilicon layer. The transfer gate TG may include a first pattern 210 and a second pattern 230, which are positioned at lower and upper regions, respectively, of the recessed region 150. The first pattern 210 and the first doped region 110 may be spaced apart from each other by a small distance (e.g., less than 0.5 μm). When the distance between the first pattern 210 and the first doped region 110 decreases, it is possible to quickly move electrons from the first doped region 110 to the floating diffusion region FD.

The first pattern 210 may have a different conductivity type from that of the second pattern 230. For example, the first pattern 210 may be doped with p-type impurities or may be in an intrinsic state, whereas the second pattern 230 may be doped with n-type impurities. Alternatively, the first pattern 210 may have a different doping concentration from that of the second pattern 230. For example, the first pattern 210 may be lightly doped with n-type impurities, whereas the second pattern 230 may be heavily doped with n-type impurities. As an example, the first pattern 210 may be provided to have a low concentration of $10^{16}/cm^3$ or lower, and the second pattern 230 may be provided to have a high concentration of $10^{18}/cm^3$ or higher. The difference in doping type or concentration between the first pattern 210 and the second pattern 230 may lead to a difference in energy level of the transfer gate TG, when a voltage is applied to the transfer gate TG. A Fermi level of a heavily-doped n-type region may be higher than that of a lightly-doped n-type region, and a Fermi level of an n-type doped region may be higher than that of a p-type doped region.

The second doped region 130 adjacent the transfer gate TG may be affected by the doping property of the transfer gate TG. For example, there may be a difference in effective potential between two portions, adjacent the first and second patterns 210 and 230, of the second doped region 130. This difference in the effective potential may allow a drift field to be produced between the two portions, adjacent the first and second patterns 210 and 230, of the second doped region 130. In a conventional structure of the transfer gate TG, electrons generated in the photoelectric conversion region may be captured by the transfer gate TG, and thus, it may be difficult to move the electrons from the photoelectric conversion region PD to the floating diffusion region FD. In contrast, according to some embodiments described herein, the drift field at the second doped region 130 and the consequent electrostatic force may make it easy to move the electrons from a region below the transfer gate TG to a high potential region. In other words, the afore-described structure of the transfer gate TG may make it possible to allow the electrons to be moved toward the floating diffusion region FD along the side surface of the transfer gate TG, without being captured under the transfer gate TG. Accordingly, it is possible for electrons to be moved from the photoelectric conversion region PD to the floating diffusion region FD at an increased speed.

In contrast, when the image sensor 1 is composed of PMOS transistors, the first pattern 210 may be doped with n-type impurities or may be in an intrinsic state, whereas the second pattern 230 may be doped with p-type impurities. Alternatively, the first pattern 210 may have a different doping concentration from that of the second pattern 230. For example, the first pattern 210 may be lightly doped with p-type impurities, whereas the second pattern 230 may be heavily doped with p-type impurities. As an example, the first pattern 210 may be provided to have a low concentration of $10^{16}/cm^3$ or lower, and the second pattern 230 may be provided to have a high concentration of $10^{18}/cm^3$ or higher. The difference in doping type or concentration between the first pattern 210 and the second pattern 230 may lead to a difference in energy level of the transfer gate TG, when a voltage is applied to the transfer gate TG. A Fermi level of a heavily-doped p-type region may be lower than that of a lightly-doped n-type region, and a Fermi level of a p-type doped region may be lower than that of an n-type doped region. For example, there may be a difference in effective potential between two portions, adjacent the first and second patterns 210 and 230, of the second doped region 130. This difference in the effective potential may allow a drift field to be produced between the two portions, adjacent the first and second patterns 210 and 230, of the second doped region 130. According to some embodiments described herein, the drift field at the second doped region 130 and the consequent electrostatic force may make it easy for holes to be moved toward a low potential region, and thus, the holes can be easily moved toward the floating diffusion region FD along the side surface of the transfer gate TG, without being captured in a region below the transfer gate TG.

A gate insulating layer 250 may be disposed between the transfer gate TG and the recessed region 150. For example, the gate insulating layer 250 may be formed of or include silicon oxide ($SiO_2$), silicon oxynitride (SiON), silicon nitride (SiN), germanium oxynitride (GeON), germanium silicon oxide (GeSiO) and/or high-k dielectric materials. Here, the high-k dielectric materials may include hafnium oxide (HfO), zirconium oxide (ZrO), aluminum oxide (AlO), tantalum oxide (TaO), hafnium silicate (HfSi) and/or zirconium silicate (ZrSi), etc. The gate insulating layer 250 may be formed by layering at least two of the above listed materials.

The floating diffusion region FD may be adjacent the transfer gate TG. Electrons may be moved along the side surface of the transfer gate TG and may be supplied into the floating diffusion region FD. The floating diffusion region FD may have the same conductivity type as the first doped region 110 and the second pattern 230. For example, the floating diffusion region FD may be doped with n-type impurities. The electrons, which are moved along the side surface of the transfer gate TG, may be accumulated in the floating diffusion region FD.

In contrast, when the image sensor 1 is composed of PMOS transistors, the floating diffusion region FD may be doped with p-type impurities. In this case, holes may be moved along the side surface of the transfer gate TG and may be accumulated in the floating diffusion region FD.

FIG. 3 may also be regarded as illustrating an image sensor 1, according to other embodiments described herein. The image sensor 1 comprises a substrate 100 having face 102. A photoelectric conversion portion PD is provided in the substrate 100. The photoelectric conversion portion PD defines a recess 150 in the substrate 100 that extends from the face 102 into the substrate 100. A transfer gate TG is provided in the recess and is non-uniformly doped in a direction extending from the face 102 into the substrate 100, illustrated as the "x" direction of FIG. 3. A floating diffusion region FD is also provided adjacent the transfer gate. As also illustrated, the transfer gate TG comprises a first region 210 in the recess 150 remote from the face 102 and a second region 230 in the recess 150 adjacent the face 102. The first and second regions 210, 230, respectively, have opposite conductivity types, in some embodiments. Alternatively, the first and second regions 210, 230, respectively, have a same conductivity type but different doping concentrations in other embodiments.

FIGS. 4A through 4E are sectional views illustrating an example of a method of fabricating an image sensor, according to some embodiments described herein.

Figure 4A:
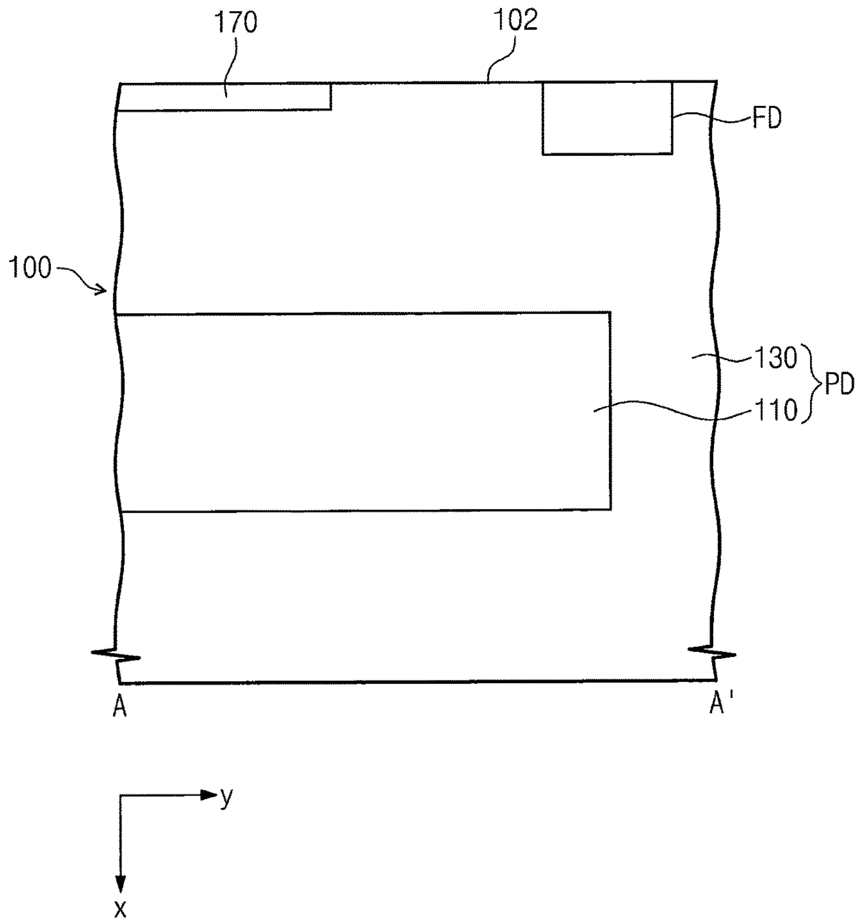
FIGS. 4A through 4E are sectional views illustrating an example of a method of fabricating an image sensor, according to some embodiments described herein.

Referring to FIG. 4A, a p-type epitaxial layer may be formed on the substrate, the remainder of which is not shown. Thus, the substrate 100 may include the epitaxial layer and an underlying portion. The epitaxial layer may be the second doped region 130 shown in FIG. 4A. An ion implantation process may be performed on the second doped region 130 to form the first doped region 110, the floating diffusion region FD, and the blocking region 170. The first doped region 110 may be formed by injecting n-type impurities into the second doped region 130 through the face 102, and the floating diffusion region FD may be formed by injecting n-type impurities through the face 102 into an upper portion of the second doped region 130. The n-type impurities may be or include arsenic (As) and/or phosphorus (P). Also, the blocking region 170 may be formed by injecting p-type impurities through the face into the upper portion of the second doped region 130. The blocking region 170 may be doped to have a doping concentration higher than that of the second doped region 130. The p-type impurities may include boron (B), boron fluoride ($BF_2$) and/or indium (In).

In contrast, when the image sensor 1 is composed of PMOS transistors, the second doped region 130 may be formed to have n-type conductivity. The first doped region 110 may be formed by injecting p-type impurities through the face 102 into the second doped region 130, and the floating diffusion region FD may be formed by injecting p-type impurities through the face 102 into an upper portion of the second doped region 130. Also, the blocking region 170 may be formed by injecting n-type impurities through the face 102 into the upper portion of the second doped region 130. The blocking region 170 may be doped to have a doping concentration higher than that of the second doped region 130.

Figure 4B:
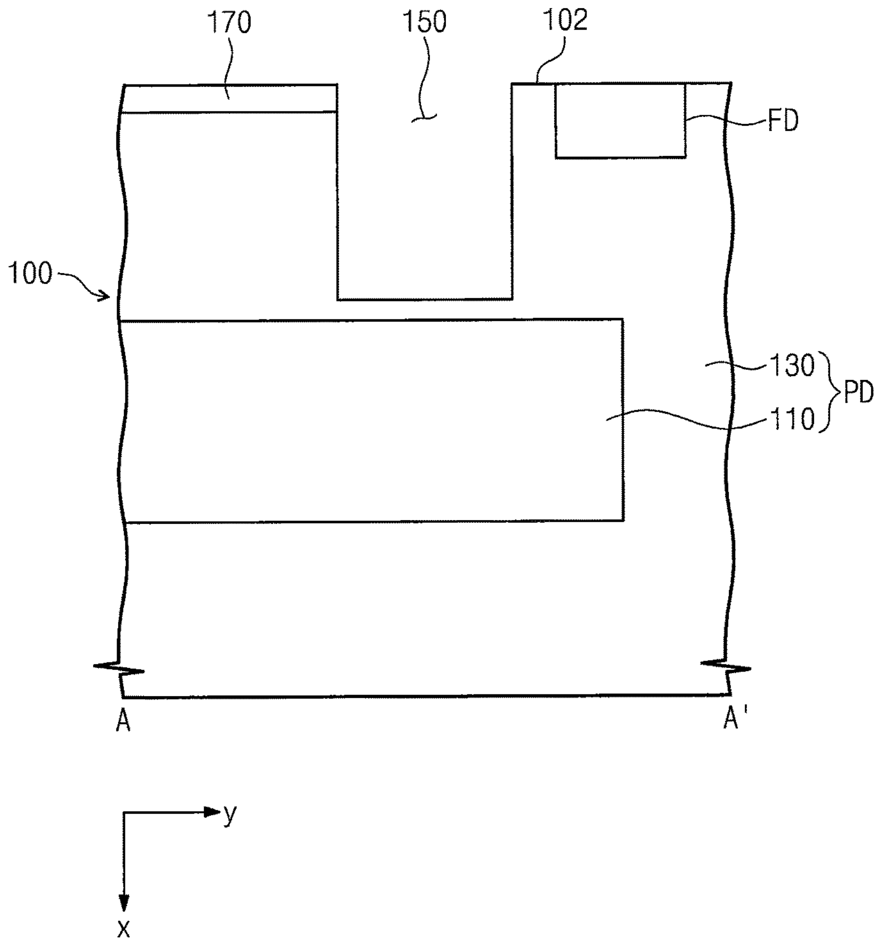

Referring to FIG. 4B, the recessed region 150 may be formed in the second doped region 130 to extend from the face 102 into the substrate 100. For example, an etching process may be performed to etch the second doped region 130 in the first direction x from the face 102 (also referred to as a top surface) of the second doped region 130 toward the first doped region 110. The recessed region 150 may be formed to be spaced apart from the first doped region 110 in the first direction x.

Figure 4C:
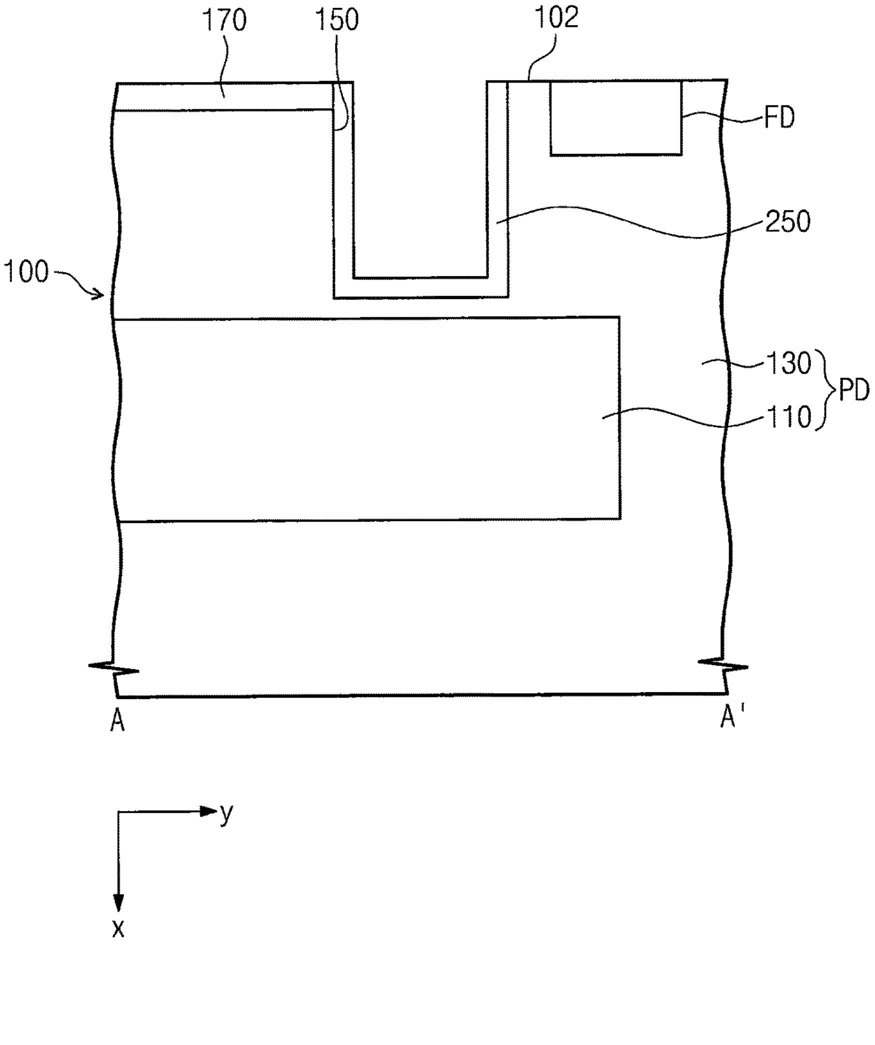

Referring to FIG. 4C, the gate insulating layer 250 may be formed on, and in some embodiments to cover, the recessed region 150. The gate insulating layer 250 may be formed of or include silicon oxide ($SiO_2$), silicon oxynitride (SiON), silicon nitride (SiN), germanium oxynitride (GeON), germanium silicon oxide (GeSiO) and/or high-k dielectric materials. Here, the high-k dielectric materials may include hafnium oxide (HfO), zirconium oxide (ZrO), aluminum oxide (AlO), tantalum oxide (TaO), hafnium silicate (HfSi) and/or zirconium silicate (ZrSi), etc. The gate insulating layer 250 may be formed by layering at least two of the above listed materials.

Figure 4D:
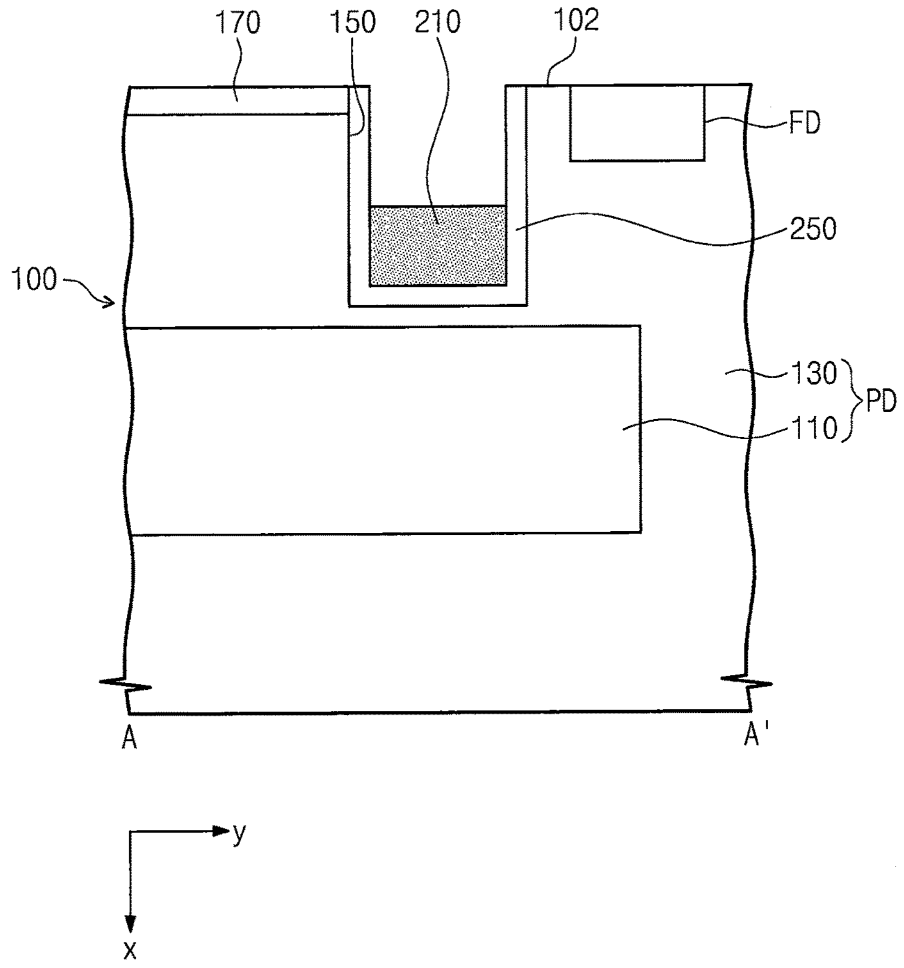

Referring to FIG. 4D, the first pattern 210 may be formed on the gate insulating layer 250. Various processes may be used to form the first pattern 210. As an example, a first layer may be formed on the gate insulating layer 250. The first layer may be formed of or include an intrinsic polysilicon layer. For example, the first pattern 210 may be formed by doping the first layer with p-type impurities or with n-type impurities of low concentration. As an example, the first pattern 210 may be formed by depositing a p-type polysilicon layer or a lightly-doped n-type polysilicon layer. In certain embodiments, the first pattern 210 may be formed by depositing an intrinsic polysilicon layer.

In contrast, when the image sensor 1 is composed of PMOS transistors, the first pattern 210 may be formed of an n-type semiconductor material, a lightly-doped p-type semiconductor material and/or an intrinsic semiconductor material. The first pattern 210 may be formed using substantially the same method as when the image sensor 1 includes the NMOS transistors.

Figure 4E:
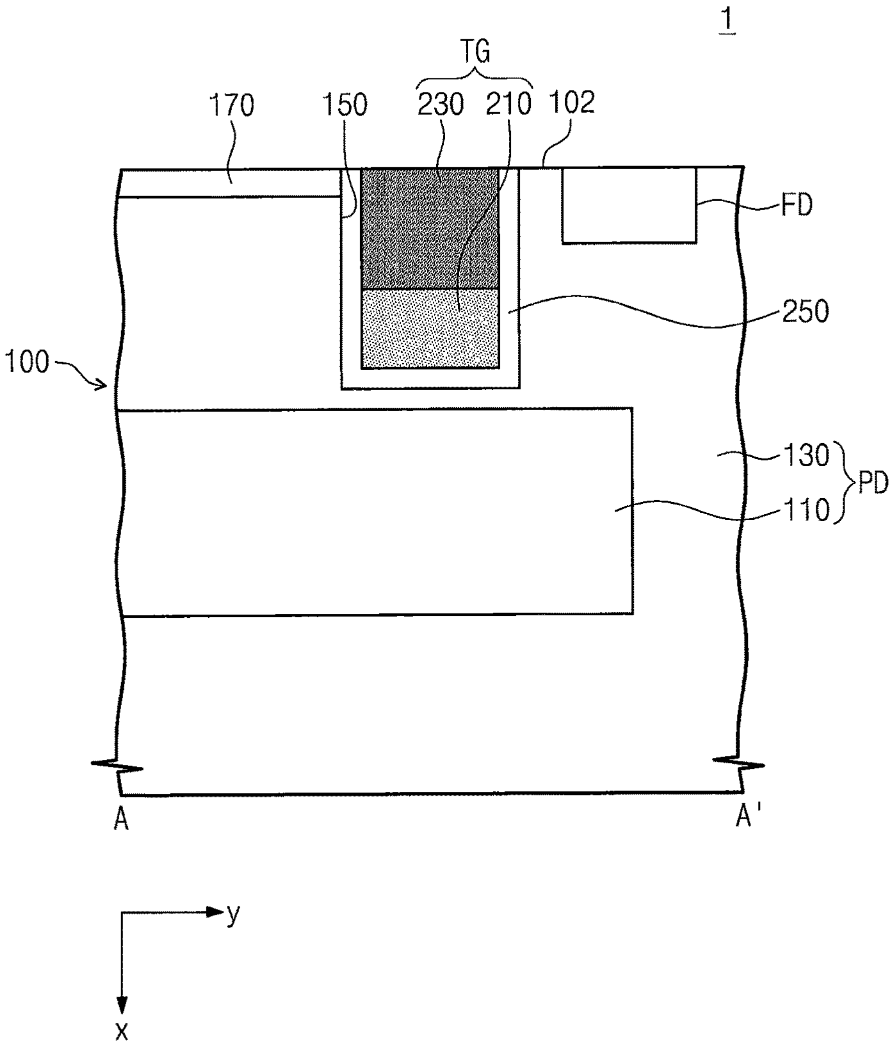

Referring to FIG. 4E, the second pattern 230 may be formed on the first pattern 210, and the first and second patterns 210 and 230 may constitute the transfer gate TG. Various processes may be used to form the second pattern 230. As an example, the formation of the second pattern 230 may include forming a second layer on the first pattern 210 and injecting n-type impurities into the second layer. The second layer may be formed of or include an intrinsic polysilicon layer. When the first pattern 210 is lightly doped with n-type impurities, the second pattern 230 may be formed to have an n-type doping concentration higher than that of the first pattern 210. In some embodiments, the second pattern 230 may be formed by depositing an n-type polysilicon layer. When the first pattern 210 is lightly doped with n-type impurities, the second pattern 230 may be formed by depositing a n-type polysilicon layer, whose doping concentration is higher than that of the first pattern 210.

In contrast, when the image sensor 1 is composed of PMOS transistors, the second pattern 230 may be formed to have p-type conductivity. When the first pattern 210 is lightly doped with p-type impurities, the second pattern 230 may be formed to have a p-type doping concentration higher than that of the first pattern 210. The second pattern 230 may be formed using substantially the same method as when the image sensor 1 includes the NMOS transistors.

Figure 5A:
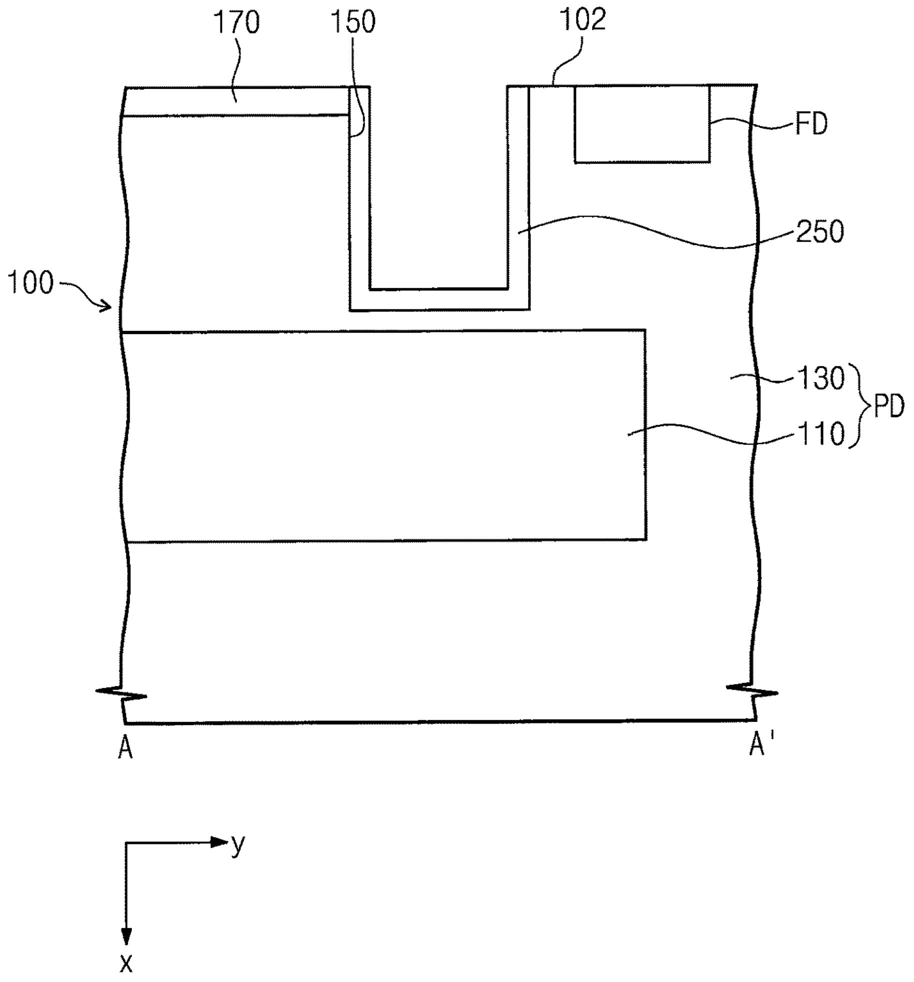
FIGS. 5A through 5C are sectional views illustrating an example of a method of fabricating an image sensor, according to some embodiments described herein.
Figure 5B:
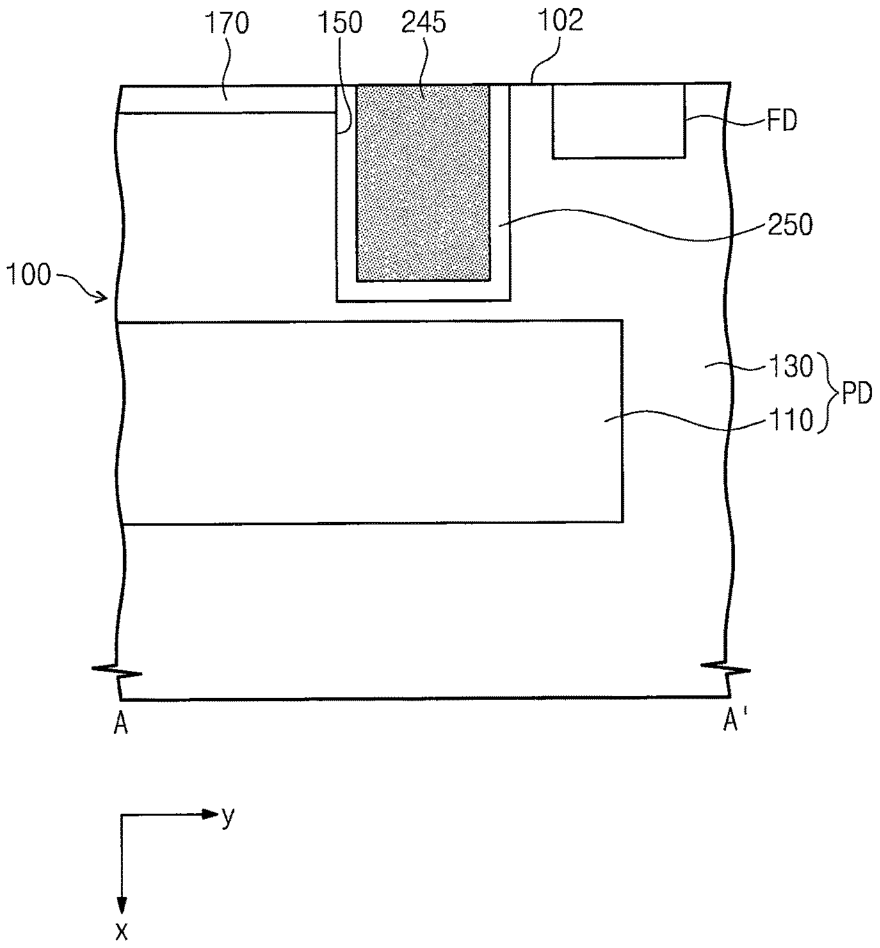
Figure 5C:
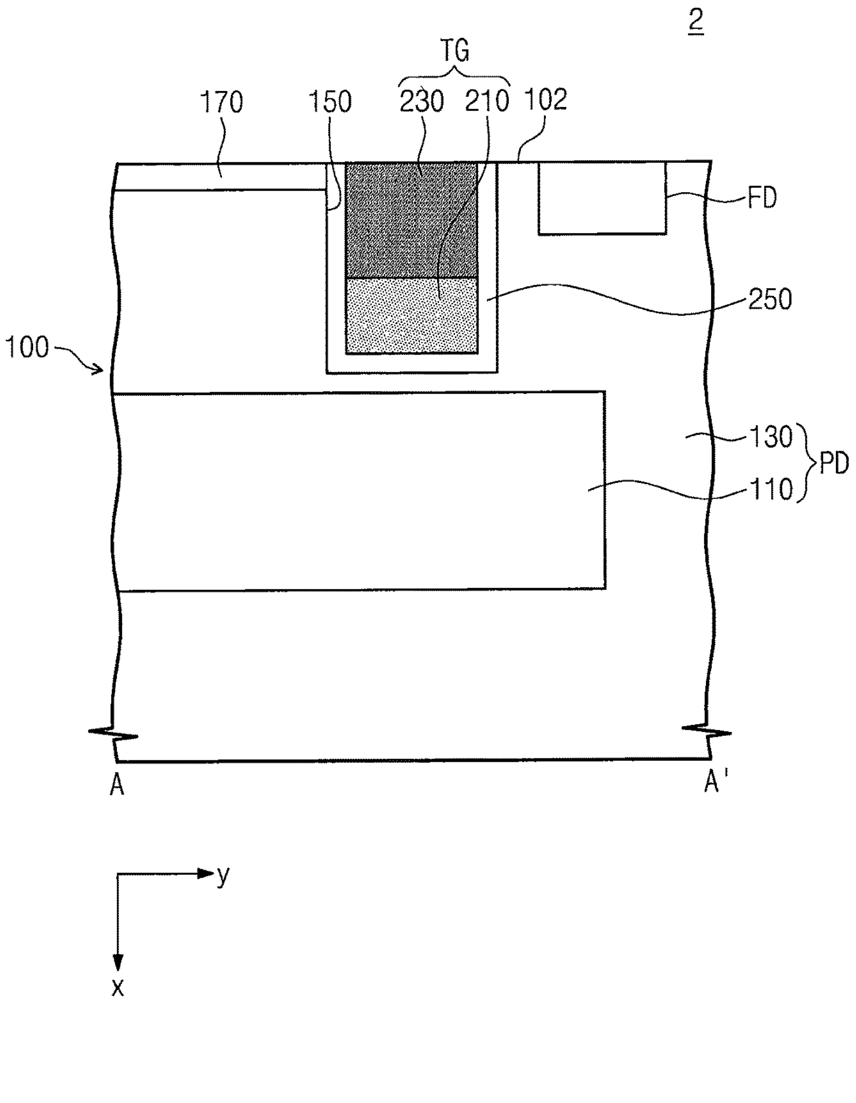

FIGS. 5A through 5C are sectional views illustrating an example of a method of fabricating an image sensor, according to some embodiments described herein. FIGS. 5A through 5C illustrate processes which will be performed after the processes of FIGS. 4A through 4C. Hereinafter, for the sake of simplicity, the description that follows will refer to an example in which the image sensor 2 includes NMOS transistors. For concise description, a previously described element may be identified by a similar or identical reference number without repeating an overlapping description thereof.

Referring to FIG. 5A, the photoelectric conversion region PD may be formed to include the first doped region 110 doped with n-type impurities and the second doped region 130 doped with p-type impurities. The n-type impurities may include arsenic (As) and/or phosphorus (P), and the p-type impurities may include boron (B), boron fluoride ($BF_2$) and/or indium (In). The recessed region 150 may be formed in the second doped region 130, and the gate insulating layer 250 may be formed on the recessed region 150. The gate insulating layer 250 may be formed of or include silicon oxide ($SiO_2$), silicon oxynitride (SiON), silicon nitride (SiN), germanium oxynitride (GeON), germanium silicon oxide (GeSiO) and/or high-k dielectric materials. Here, the high-k dielectric materials may include hafnium oxide (HfO), zirconium oxide (ZrO), aluminum oxide (AlO), tantalum oxide (TaO), hafnium silicate (HfSi) and/or zirconium silicate (ZrSi), etc. The gate insulating layer 250 may be formed by layering at least two of the above listed materials.

Referring to FIG. 5B, a preliminary transfer gate 245 may be formed in the recessed region 150. The preliminary transfer gate 245 may be formed on the gate insulating layer 250. The preliminary transfer gate 245 may be formed of or include a p-type polysilicon layer, a lightly-doped n-type polysilicon layer and/or an intrinsic polysilicon layer. The n-type dopants for the preliminary transfer gate 245 may include arsenic (As) and/or phosphorus (P), and the p-type dopants for preliminary transfer gate 245 may include boron (B), boron fluoride ($BF_2$) and/or indium (In).

In contrast, when the image sensor 2 is composed of PMOS transistors, the preliminary transfer gate 245 may be formed of or include an n-type polysilicon layer, a lightly-doped p-type polysilicon layer and/or an intrinsic polysilicon layer.

Referring to FIG. 5C, an ion implantation process may be performed to heavily dope an upper portion of the preliminary transfer gate 245 with n-type impurities, thereby forming the transfer gate TG. The n-type impurities may be or include arsenic (As) and/or phosphorus (P). The transfer gate TG may include the first pattern 210, which is doped with p-type impurities, is lightly doped with n-type impurities and/or is formed of an intrinsic semiconductor material, and the second pattern 230, which is heavily doped with n-type impurities. When measured in a downward direction, the first pattern 210 may be formed to have an increasing p-type doping concentration or a decreasing n-type doping concentration and the second pattern 230 may be formed to have a decreasing n-type doping concentration. In some embodiments, an upper portion of the transfer gate TG may be formed of a heavily-doped n-type semiconductor material, and the lower portion of the transfer gate TG may be formed of a lightly-doped n-type semiconductor material, a p-type semiconductor material and/or an intrinsic semiconductor material.

In contrast, when the image sensor 2 is composed of PMOS transistors, the preliminary transfer gate 245 may be formed of or include an n-type semiconductor material and/or a lightly-doped p-type semiconductor material. The preliminary transfer gate 245 may be heavily doped with p-type impurities, and as a result, the transfer gate TG may be formed in the recessed region 150. The p-type impurities may include boron (B), boron fluoride (BF2) and/or indium (In). The transfer gate TG may include the first pattern 210, which is doped with n-type impurities, is lightly doped with p-type impurities and/or is formed of an intrinsic semiconductor material, and the second pattern 230, which is heavily doped with p-type impurities. When measured in a downward direction, the first pattern 210 may be formed to have an increasing p-type doping concentration and/or a decreasing n-type doping concentration and the second pattern 230 may be formed to have a decreasing n-type doping concentration. In some embodiments, an upper portion of the transfer gate TG may be formed of a heavily-doped p-type semiconductor material, and the lower portion of the transfer gate TG may be formed of a lightly-doped p-type semiconductor material, an n-type semiconductor material and/or an intrinsic semiconductor material.

Figure 6:
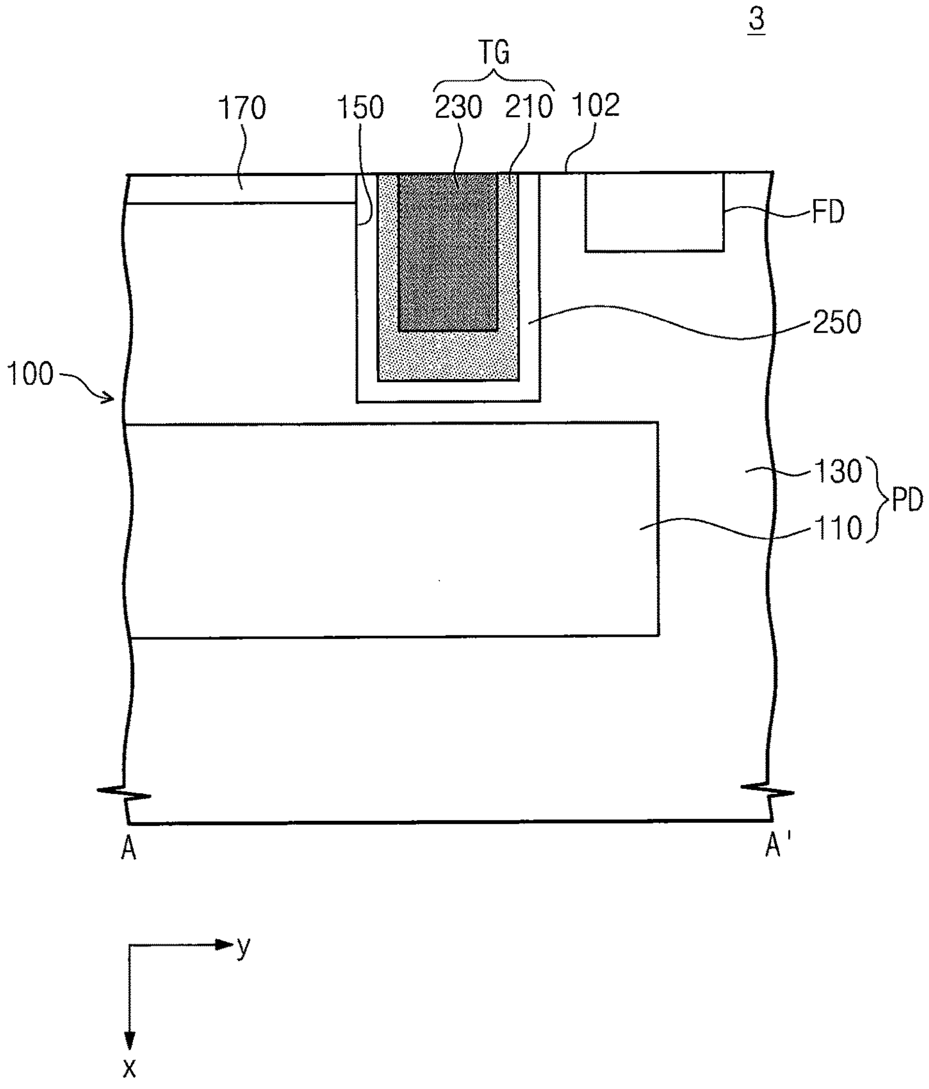
FIGS. 6 through 8 are sectional views illustrating some examples of image sensors according to some embodiments described herein.
Figure 7:
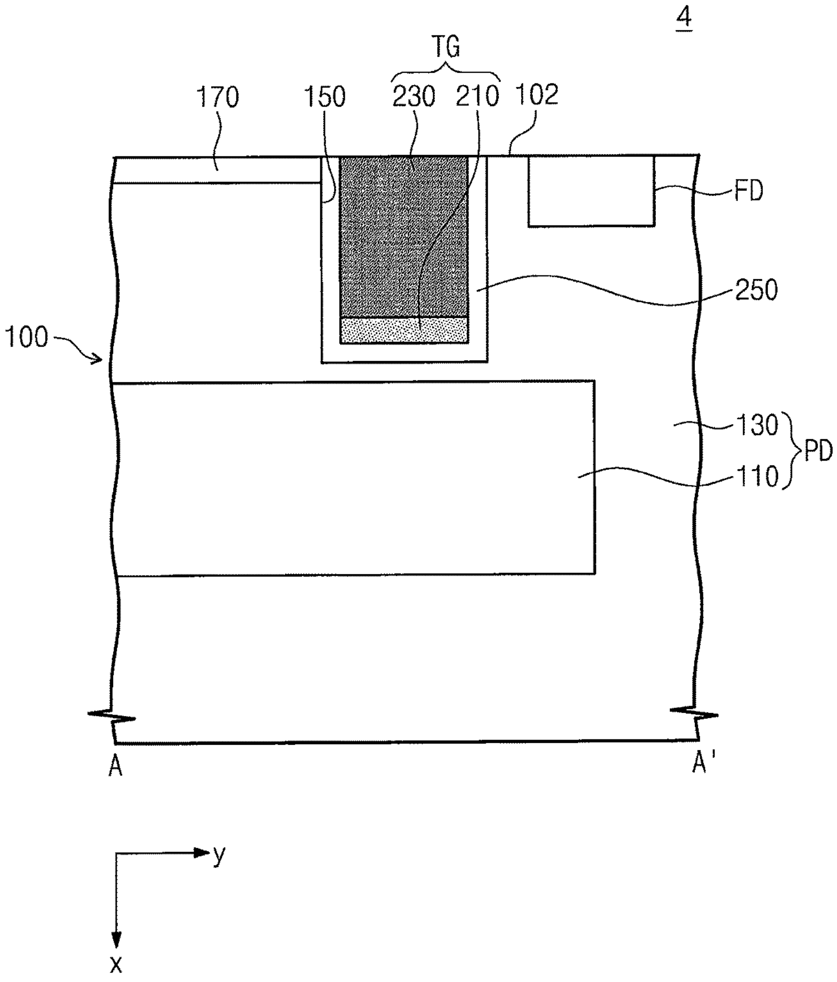
Figure 8:
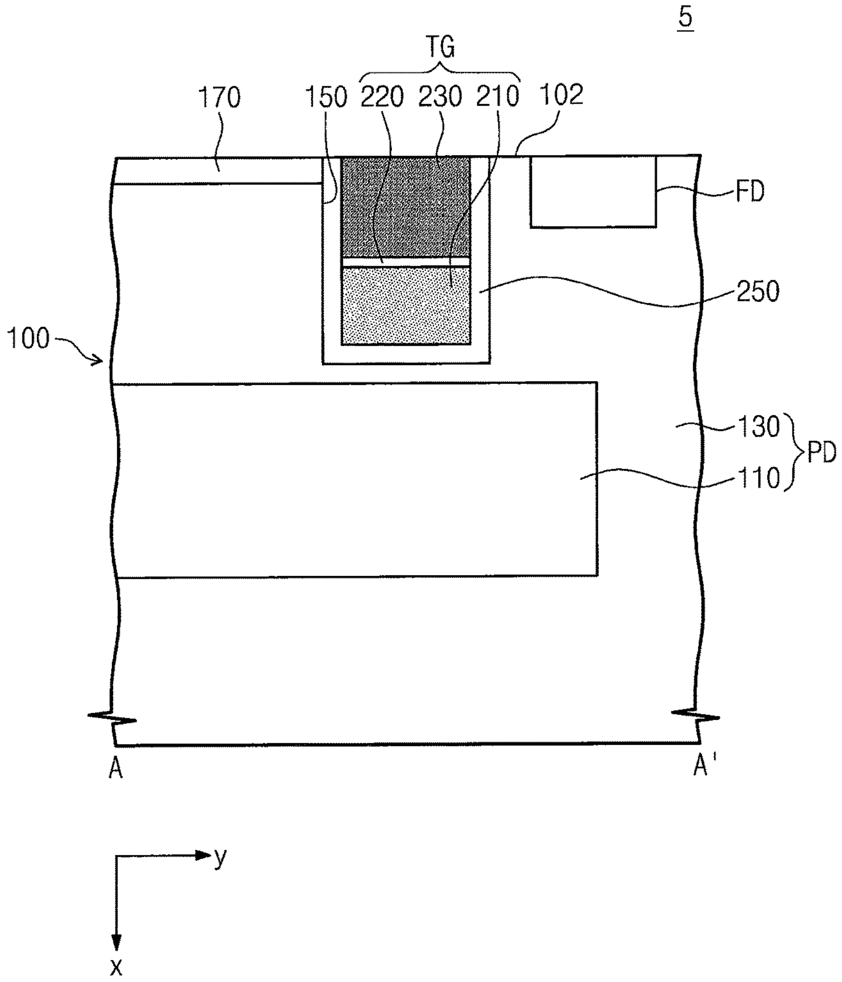

FIGS. 6 through 8 are sectional views illustrating some examples of image sensors according to some embodiments described herein. Hereinafter, for the sake of simplicity, the description that follows will refer to an example in which an image sensor 3, 4, or 5 includes NMOS transistors.

Referring to FIG. 6, the first pattern 210 may be provided to face side and bottom surfaces of the recessed region 150, and the second pattern 230 may be provided in a gap region defined by the first pattern 210. The gate insulating layer 250 may be provided between the first pattern 210 and the recessed region 150. In some embodiments, the first pattern 210 may be provided to have a "U"-shaped cross-section. The second pattern 230 may be provided to fill the recessed region 150 provided with the first pattern 210. Referring to FIG. 7, the first pattern 210 may be shorter than the second pattern 230, when measured in the first direction x. There may be a difference in effective potential between two portions, adjacent the first and second patterns 210 and 230, of the second doped region 130. This difference in the effective potential may allow a drift field to be produced between the two portions of the second doped region 130. In some embodiments, since the first pattern 210 has a relatively small thickness, the drift field produced in the second doped region 130 may have a relatively small magnitude. However, since the drift field is locally produced in a relatively low region of the transfer gate TG, it is possible to increase a mean speed of electrons moving along the side surface of the transfer gate TG. Accordingly, it is possible to reduce or prevent the electrons from being captured in a region below the transfer gate TG.

Referring to FIG. 8, an insulating layer 220 may be provided between the first pattern 210 and the second pattern 230. For example, the insulating layer 220 may be provided to have a small thickness (e.g., of several tens nanometers or less). The insulating layer 220 may be formed of or include at least one of silicon oxide ($SiO_2$), silicon oxynitride (SiON) and/or silicon nitride (SiN). The insulating layer 220 may reduce or prevent electrons or holes from being diffused from one of the first and second patterns 210 and 230 to the other. Also, the insulating layer 220 may allow each of the first and second patterns 210 and 230 to be maintained at a uniform doping concentration. The larger a difference in doping concentration between the first and second patterns 210 and 230, the greater the drift field.

FIGS. 9 through 13 are sectional views illustrating some examples of image sensors according to some embodiments described herein. Hereinafter, for the sake of simplicity, the description that follows will refer to an example in which an image sensor 6, 7, 8, 9, or 10 includes NMOS transistors. For concise description, a previously described element may be identified by a similar or identical reference number without repeating an overlapping description thereof.

Figure 9:
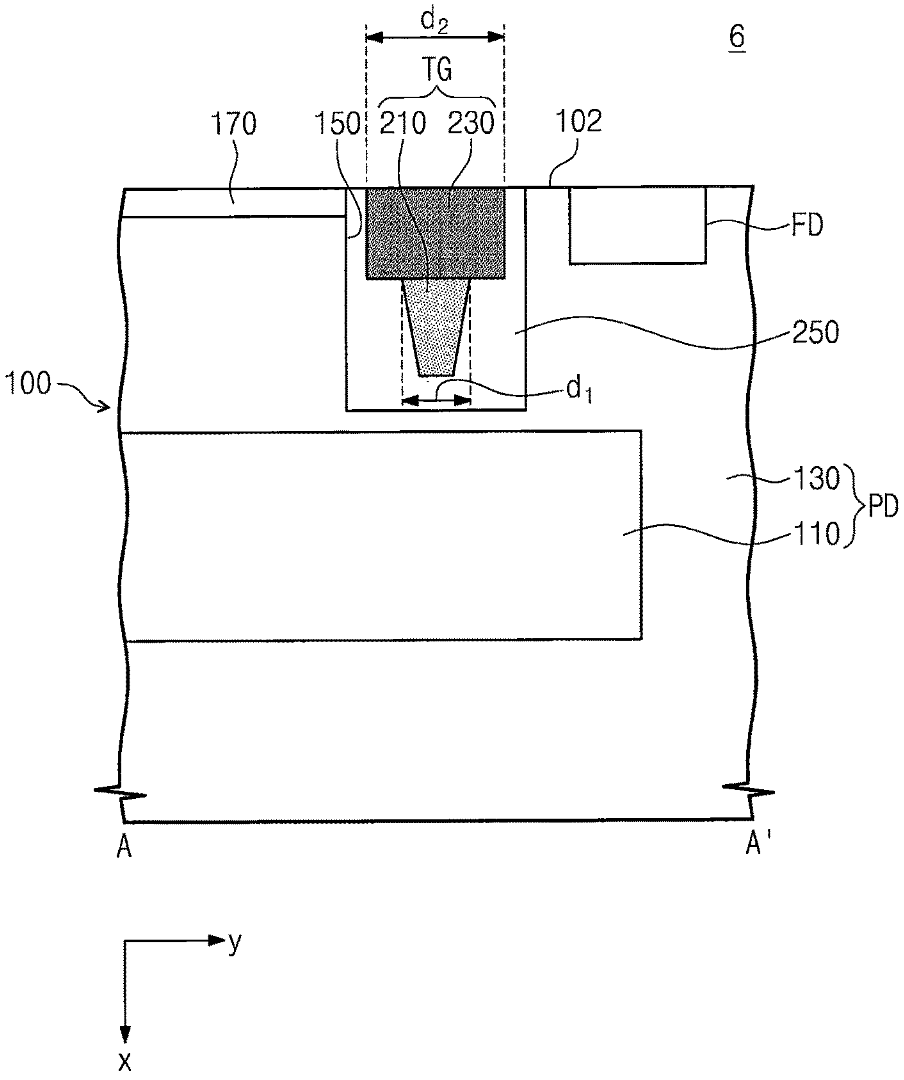
FIGS. 9 through 13 are sectional views illustrating some examples of image sensors according to some embodiments described herein.

Referring to FIG. 9, the transfer gate TG may include the first pattern 210 and the second pattern 230, which are positioned at lower and upper regions, respectively, of the recessed region 150. The first pattern 210 may extend in a downward direction (e.g., the first direction x) from the second pattern 230. When measured in a second direction y perpendicular to the first direction x (i.e., a direction extending along the face 102), the second pattern 230 may have a width d2 and the first pattern 210 may have a width d1 that is smaller than the width d2. The first pattern 210 may have a decreasing width in the first or downward direction x. Since the width d1 of the first pattern 210 is smaller than the width d2 of the second pattern 230, it is possible to reduce a possibility that electrons are captured in a region below the transfer gate TG. Accordingly, it is possible for electrons to be moved from the photoelectric conversion region PD to the floating diffusion region FD at an increased speed.

Figure 10:
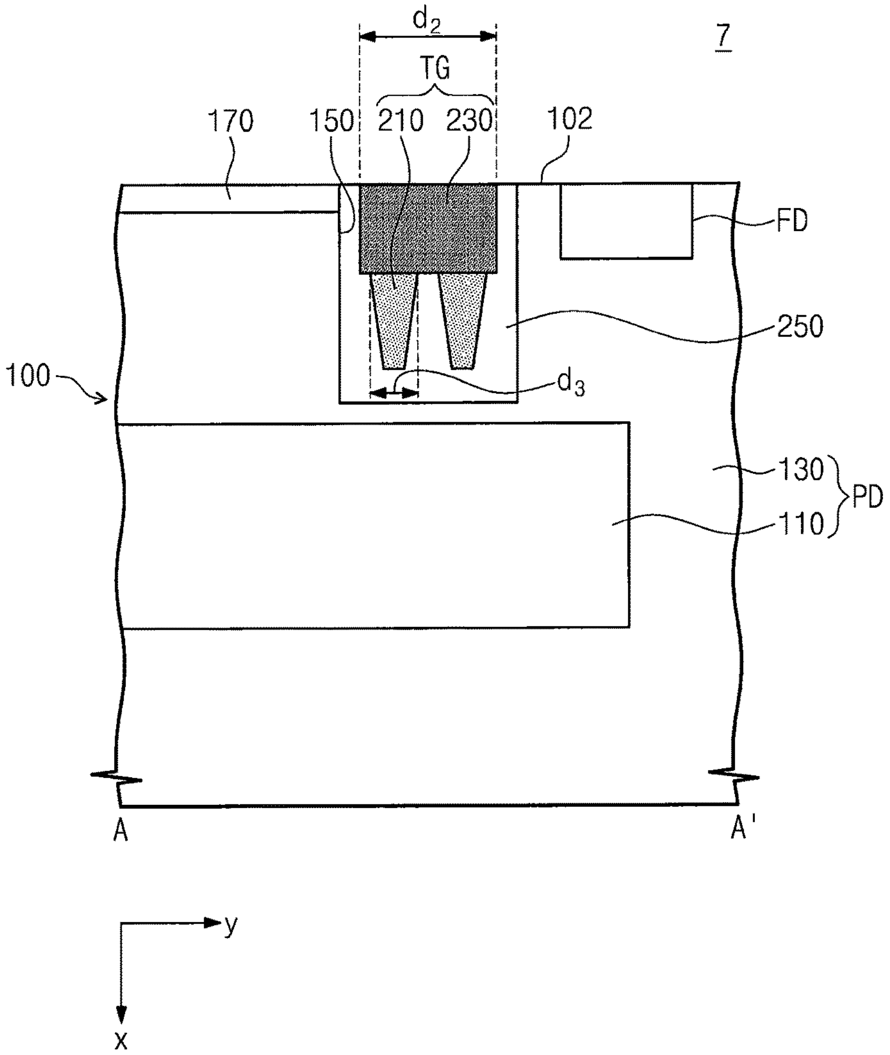

Referring to FIG. 10, a plurality of the first patterns 210 may be provided to be spaced apart from the second pattern 230 in the second direction y. When the number of the first patterns 210 is at least two, the width d3 of each of the first patterns 210 may be decreased, and this may make it possible to greatly reduce a possibility that electrons are captured in a region below the transfer gate TG. Accordingly, it is possible for electrons to be moved from the photoelectric conversion region PD to the floating diffusion region FD at an increased speed.

Figure 11:
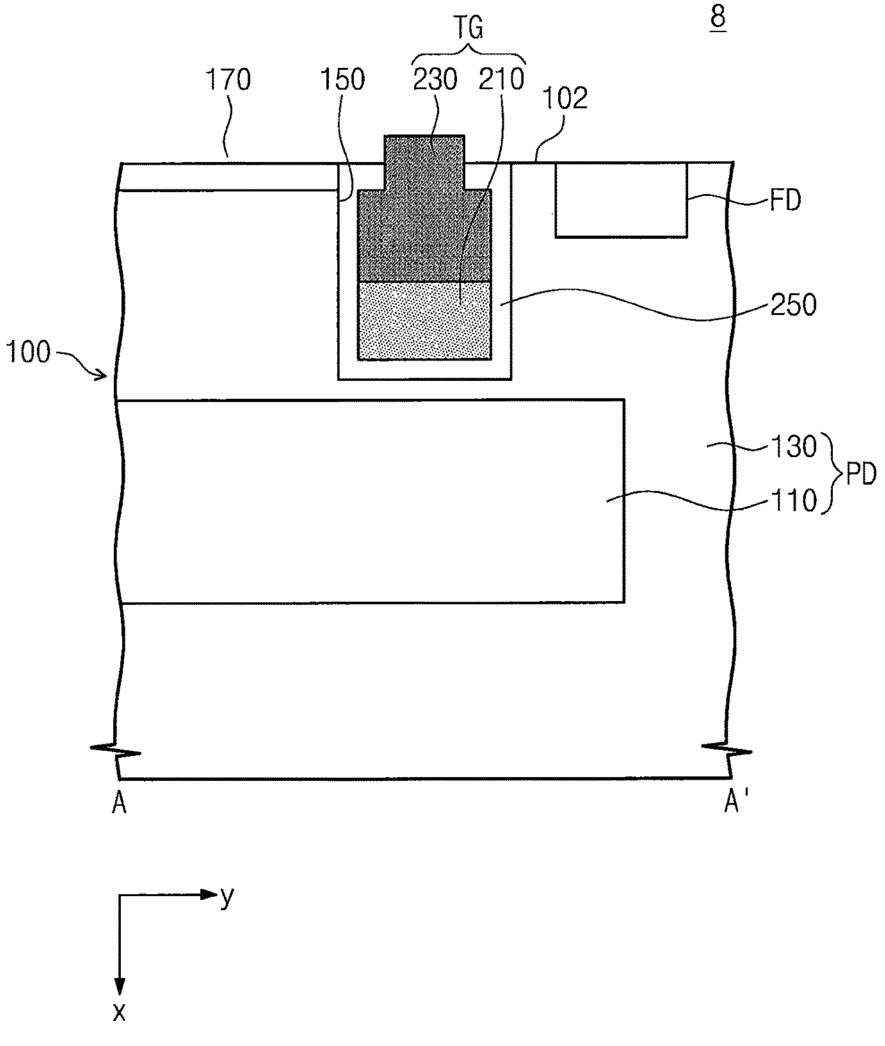

Referring to FIG. 11, the transfer gate TG may include the first pattern 210 with a uniform width and the second pattern 230 with a non-uniform width. The second pattern 230 may include lower and upper portions, which are sequentially stacked in an upward direction opposite to the first direction x. Here, the lower portion may have the same width as that of the first pattern 210, and the upper portion may have a width smaller than that of the first pattern 210. In addition, the upper portion of the second pattern 230 may be provided to protrude upwardly from the recessed region 150. For example, a side surface of the second pattern 230 may be partially exposed.

Figure 12:
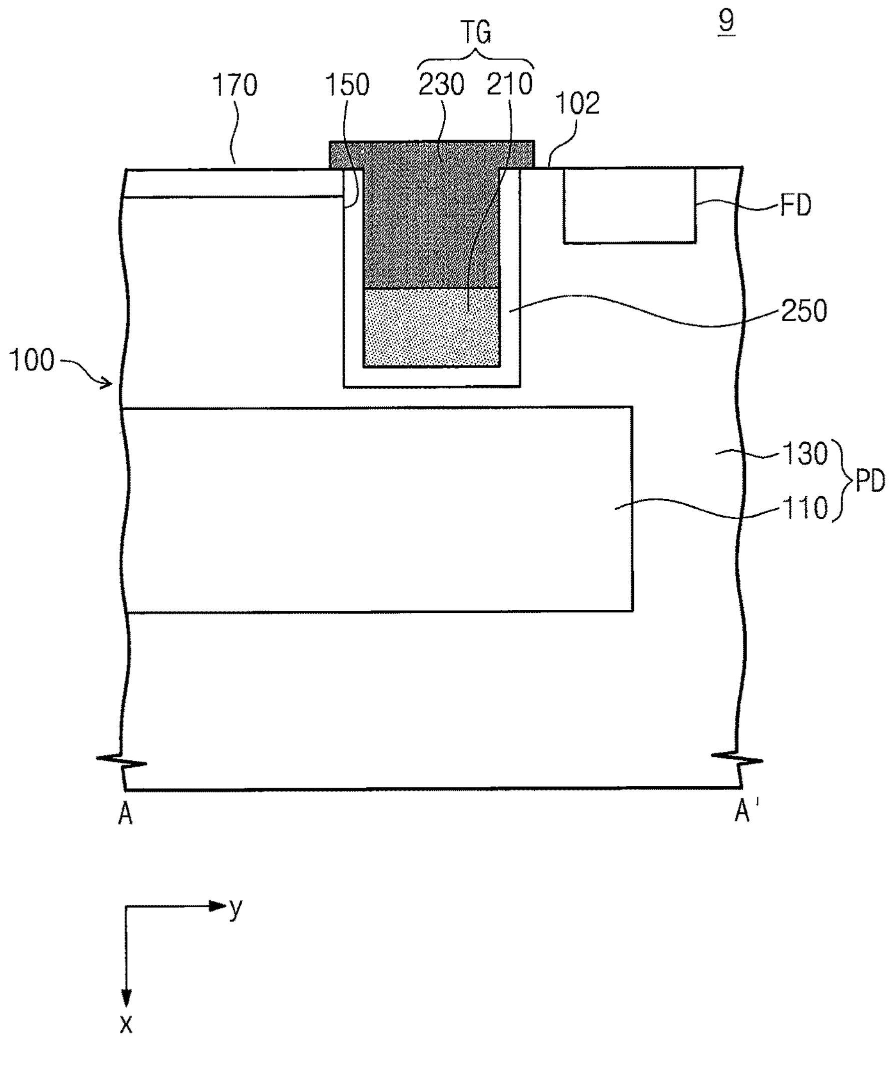

Referring to FIG. 12, the transfer gate TG may include the first pattern 210 with a uniform width and the second pattern 230 with a non-uniform width. A portion of the second pattern 230 may protrude upwardly from the recessed region 150, and the protruding portion of the second pattern 230 may be wider than the remaining portion of the second pattern 230. For example, the second pattern 230 may include a portion that is disposed on the gate insulating layer 250 and may have a partially-exposed sidewall.

Figure 13:
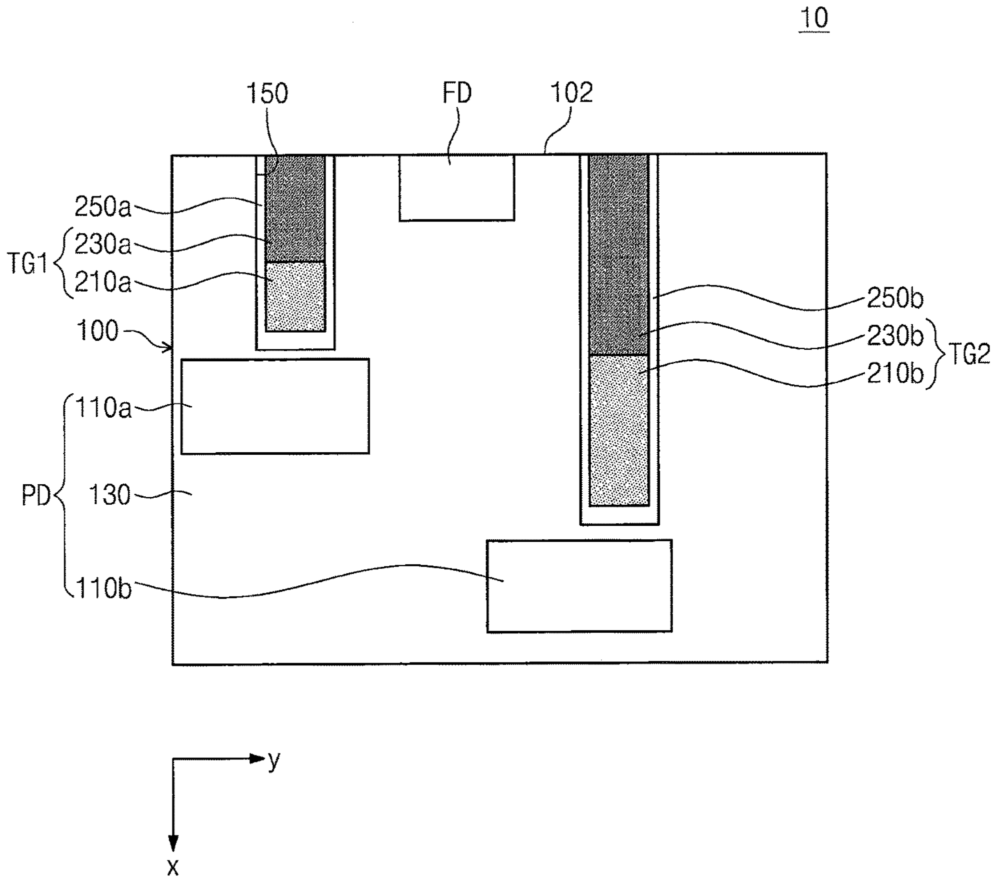

Referring to FIG. 13, a plurality of transfer gates TG1 and TG2 and a plurality of first doped regions 110*a* and 110*b* may be provided to share the floating diffusion region FD. The transfer gates TG1 and TG2 may include a first transfer gate TG1 and a second transfer gate TG2. The first transfer gate TG1 may include a first lower pattern 210*a* and a first upper pattern 230*a*, and the second transfer gate TG2 may include a second lower pattern 210*b* and a second upper pattern 230*b*. The transfer gates TG1 and TG2 may be provided to have at least two different lengths in the first direction x. Accordingly, in the second doped region 130, the first doped regions 110*a* and 110*b* may be provided to have vertical levels different from each other. Electrons or holes generated in the photoelectric conversion region PD may be moved along side surfaces of the transfer gates TG1 and TG2 and may be accumulated in the floating diffusion region FD. When the second transfer gate TG2 is longer than the first transfer gate TG1 in the first direction x, the second lower pattern 210*b* may be provided to have a length longer than that of the first lower pattern 210*a*.

Unlike the afore-described example, the floating diffusion regions FD may be provided to be adjacent the transfer gates TG1 and TG2, respectively.

According to some embodiments described herein, a transfer gate for transferring electrons or holes to a floating diffusion region may be configured to include two regions that are different from each other in terms of their conductivity types or doping concentrations.

According to some embodiments described herein, a difference in electric potential between the two regions of the transfer gate may make it possible to allow electrons or holes below the transfer gate to be moved at a higher speed.

While some embodiments described herein have been particularly shown and described, it will be understood by one of ordinary skill in the art that variations in form and detail may be made therein without departing from the spirit and scope of the attached claims.

What is claimed is:

1. An image sensor, comprising:

a substrate;

a photoelectric conversion portion in the substrate, defining a recessed region in the substrate;

a transfer gate in the recessed region; and a floating diffusion region adjacent to the transfer gate, wherein the transfer gate comprises a first pattern and a second pattern, which are sequentially stacked in the recessed region and have different conductivity types from each other.

2. The image sensor of claim 1, wherein the first pattern comprises a p-type or intrinsic semiconductor material, and the second pattern comprises an n-type semiconductor material.

3. The image sensor of claim 1, wherein the first pattern comprises an n-type or intrinsic semiconductor material, and the second pattern comprises a p-type semiconductor material.

4. The image sensor of claim 1, wherein the second pattern has a same conductivity type as the floating diffusion region.

5. The image sensor of claim 1, wherein the second pattern has a width greater than that of the first pattern, when measured in a horizontal direction.

6. The image sensor of claim 5, wherein the first pattern comprises a plurality of portions that are spaced apart from each other in the horizontal direction.

7. The image sensor of claim 1, wherein the second pattern has a length greater than the first pattern, when measured in a vertical direction.

8. The image sensor of claim 1, wherein the first pattern is configured to face side and bottom surfaces of the recessed region and define an inner gap, and the second pattern is in the inner gap of the first pattern.

9. The image sensor of claim 1, further comprising an insulating layer between the first pattern and the second pattern.

10. An image sensor, comprising:

a substrate;

a photoelectric conversion portion in the substrate including at least one first doped region and a second doped region, the second doped region defining at least one recessed region on the first doped region;

a transfer gate in the recessed region; and a floating diffusion region adjacent to the transfer gate, wherein the transfer gate comprises a first pattern and a second pattern, which are sequentially stacked in the recessed region and have a same conductivity type and different doping concentrations.

11. The image sensor of claim 10, wherein the transfer gate comprises a plurality of transfer gates, whose vertical lengths are different from each other.

12. The image sensor of claim 10, wherein the first pattern has a doping concentration lower than that of the second pattern.

13. The image sensor of claim 10, wherein each of the first and second patterns has a varying doping concentration in a direction from the second pattern toward the first pattern.

14. The image sensor of claim 10, further comprising an insulating layer between the first pattern and the second pattern.

15. An image sensor, comprising:

a substrate having a face;

a photoelectric conversion portion in the substrate, the photoelectric conversion portion defining a recess in the substrate that extends from the face into the substrate;

a transfer gate in the recess that is non-uniformly doped in a direction extending from the face into the substrate; and a floating diffusion region adjacent the transfer gate.

16. The image sensor of claim 15 wherein the transfer gate comprises a first region in the recess remote from the face and a second region in the recess adjacent the face, the first and second regions having opposite conductivity types.

17. The image sensor of claim 15 wherein the transfer gate comprises a first region in the recess remote from the face and a second region in the recess adjacent the face, the first and second regions having a same conductivity type but different doping concentrations.

18. The image sensor of claim 15 wherein the transfer gate comprises a first region in the recess remote from the face, a second region in the recess adjacent the face and an insulating layer between the first and second regions.

19. The image sensor of claim 15 wherein the transfer gate comprises a first region in the recess adjacent to the face and a second region in the recess remote from the face that is narrower than the first region in a direction extending along the face.

20. The image sensor of claim 15 wherein the transfer gate comprises a first region in the recess adjacent to the face and a plurality of second regions in the recess remote from the face, each of which is narrower than the first region in a direction extending along the face.

* * * * *